United States Patent [19]

Odenheimer

[11] Patent Number: 4,887,279
[45] Date of Patent: Dec. 12, 1989

[54] TIMING MEASUREMENT FOR JITTER DISPLAY

[75] Inventor: Ronald P. Odenheimer, Portland, Oreg.

[73] Assignee: Tektronix, Inc., Beaverton, Oreg.

[21] Appl. No.: 246,052

[22] Filed: Sep. 19, 1988

[51] Int. Cl.$^4$ ............................................. H04B 17/00
[52] U.S. Cl. ..................................... 375/10; 358/139; 364/481; 371/20.4; 375/118
[58] Field of Search .................. 370/10, 118, 13, 17; 455/67; 371/1, 15, 22, 28; 328/155; 364/481, 484, 486, 487; 358/139

[56] References Cited

U.S. PATENT DOCUMENTS

| | | | |
|---|---|---|---|
| 4,320,516 | 3/1982 | Kammerlander | 375/118 |
| 4,350,879 | 9/1982 | Feher | 328/163 |
| 4,757,452 | 7/1988 | Scott et al. | 375/118 |
| 4,777,640 | 10/1988 | Turner et al. | 375/118 |
| 4,796,259 | 1/1989 | Troy | 371/1 |

Primary Examiner—Benedict V. Safourek
Attorney, Agent, or Firm—Francis I. Gray

[57] ABSTRACT

A timing measurement system for displaying data path and clock jitter moves an internal copy of the data clock with respect to the incoming data and clock to acquire sets of samples for each data path and the clock at sequential delay intervals. A reference time is established by examining the clock sets and determining skew extremes defined by the times when the values within a set are no longer all at one state and when the values are all at the other state. The skew extremes are averaged to establish the reference time. Likewise each data path set is examined to determine skew extremes, and the skew extremes are displayed as shaded areas with respect to the reference time for each data path. Also the clock signal is converted to a stable clock signal that is also compared in a like manner to the input clock to establish skew extremes that are displayed about the reference time as clock jitter.

8 Claims, 3 Drawing Sheets

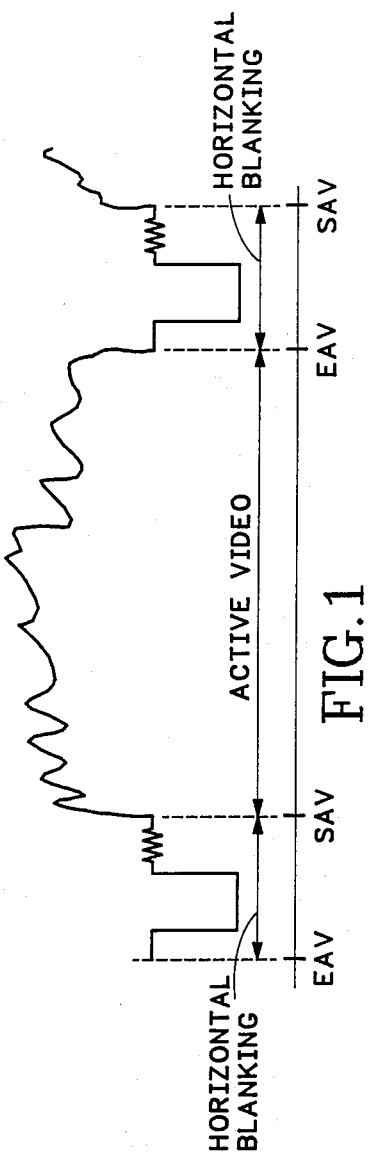
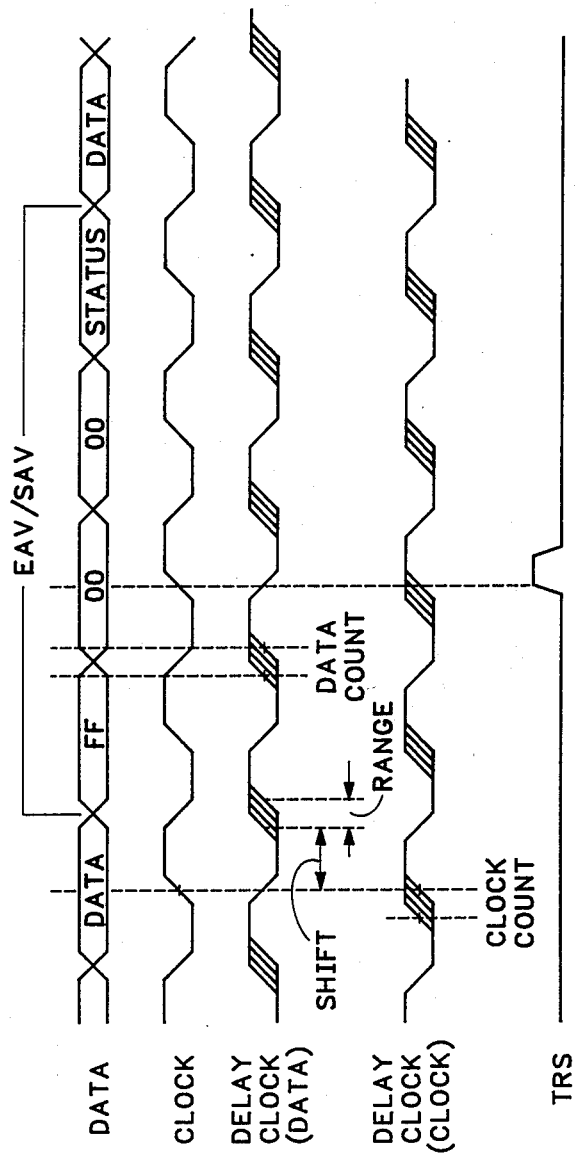
FIG. 1
FIG. 4

TIMING MEASUREMENT FOR JITTER DISPLAY

BACKGROUND OF THE INVENTION

The present invention relates to timing measurements, and more particularly to a timing measurement for a jitter display to show jitter in data edges for each bit of a multi-bit digital word due to path differences, temperature variations and the like.

In the world of electronics there are always imperfections in an otherwise perfect design. Electrical noise, such as that created by thermally generated random movement of electrons, cannot be eliminated at room temperature. All such electrical noise causes a timing or data bit pulse to jitter a few nanoseconds from one pulse to the next. Also each data bit or timing pulse path may be slightly different in length, resulting in an average deviation from a reference value by each path which is in addition to the jitter. In a digital video television system, such as that defined by the CCIR-601 standard, data is processed in the form of digital words with each bit traveling over a separate conductive path. As a result of path differences and other factors the digital bits making up a data word are skewed with respect to each other and a data clock associated with the data. Ideally the leading edge of each clock pulse of the data clock occurs exactly at the middle of each digital bit of the data word. The digital television standard may provide a limit for data clock jitter, such as +/−3 nanoseconds, and a limit for data digital bit jitter and skew with respect to the data clock, such as +/−8 nanoseconds.

What is desired is a means for determining these variations from the ideal introduced by a practical electronic processing system for display so that an operator can determine whether a digital system is operation within its specifications.

SUMMARY OF THE INVENTION

Accordingly the present invention provides a timing measurement circuit for a jitter display that determines the skew between the ideal and actual for each digital bit line of a data word processing path and displays the result as the jitter display. Input data in the form of data words are input to a timing register that is clocked by a programmably delayed clock signal derived from the data clock associated with the input data. The delay of the programmably delayed clock signal is varied until a transition between data words from one binary state to the other is detected by sampling over many horizontal lines and determining whether the binary value of the bit is all ones or all zeros for each value of the delay of the delayed clock signal. The delay time when the binary values are no longer all one state indicates the start of a jitter display period, and the delay time when the binary values are all of the opposite state indicates the end of a jitter display period. The jitter display period is shown on a display screen in the form of a bar having a length equal in time to the difference in the start and end times of the jitter period. Any jitter in the data clock itself is also determined by comparing the data clock with a very stable version of itself using a low bandwidth phase lock loop, and such data clock jitter is likewise displayed with the digital bit lines. The resulting display shows whether the data clock jitter and the data path differences fall within acceptable limits established by a particular digital video standard.

The objects, advantages and other novel features of the present invention are apparent from the following detailed description when read in conjunction with the appended claims and attached drawing.

BRIEF DESCRIPTION OF THE DRAWING

FIG. 1 is a timing diagram of a typical television video signal.

FIG. 4 is a timing diagram for the timing measurement system of FIG. 1.

DESCRIPTION OF THE PREFERRED EMBODIMENT

A digital television standard provides for the representation of an analog television signal as a series of digital data words, each data word representing a portion of a television picture horizontal line. Each horizontal line of the television signal is divided into an active video portion and a horizontal blanking portion as shown in FIG. 1. At the end of each active video portion an end of active video (EAV) group of data words is generated, and at the start of each active video portion a start of active video (SAV) group of data words is generated. The data words for EAV and SAV have a distinctive format, such as (FF, 00, 00, STATUS) where STATUS indicates whether the group is for EAV or SAV and whether the active video portion is during a vertical blanking portion or not. Ideally each data word is sampled by a data clock signal at the center of each word interval, i.e., if the duration of each data word is 40 nanoseconds, then the data clock leading edge trails the data word leading edge by 20 nanoseconds to assure valid data is being processed.

Figure 2:
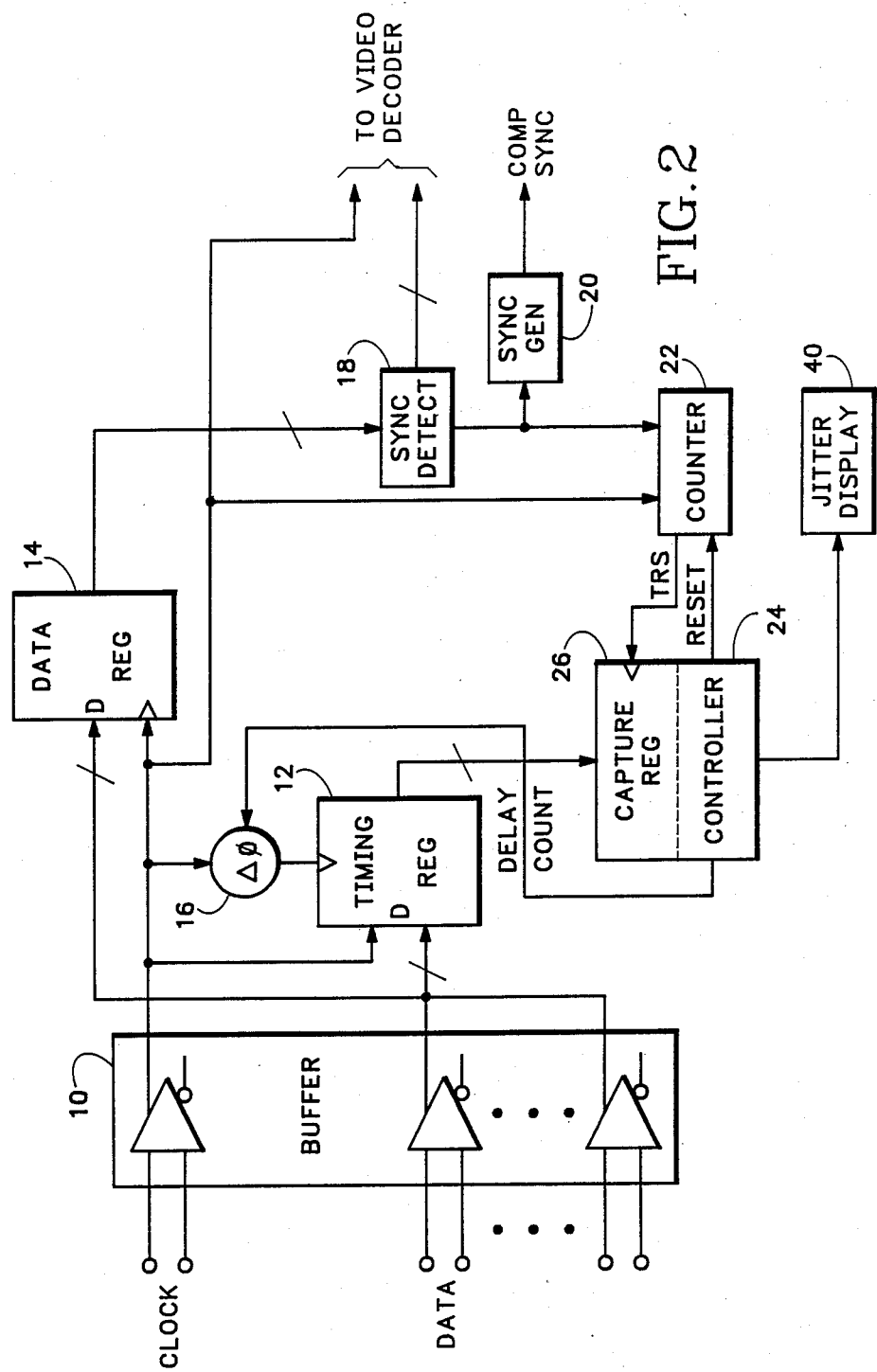
FIG. 2 is a block diagram of a timing measurement system according to the present invention.

Referring now to FIG. 2 the data clock and data words in the form of parallel data bits are received as differential inputs by a buffer amplifier 10 that converts the differential inputs to single ended outputs. The single ended outputs from the buffer amplifier 10 are input to a timing register 12 as data inputs, and the single ended outputs representing the data words are input to a data register 14 as data inputs. The data clock signal from the buffer amplifier 10 is used to clock the data bit signals into the data register 14, and is also input to a programmable clock delay circuit 16 that clocks the single ended outputs into the timing register 12. The data from the data register 14 is input to a sync detector circuit 18 that looks for the distinctive EAV and SAV groups of data words, as is well known in the art. The data words are delayed by the amount of clock cycles necessary to identify the sync point, and then are forwarded on together with the data clock signal to a standard video decoder (not shown) for conversion into the luminance and two chrominance difference components, as also is well known in the art. A sync clock from the sync detector circuit 18 is generated when the sync point is identified and is input to a sync generator 20 to produce a composite sync signal that is eventually combined with the decoded video for display on a video monitor. The sync clock is input to a counter 22 to reset the counter, and then the counter counts the data clock, which is equivalent to counting the number of data words, until a count determined by a controller 24 is achieved. When the predetermined count is achieved, the counter 22 outputs a timing reference signal, or window, that is input to a capture register 26 to transfer the data from the timing register 12 to the capture register for processing by the controller 24. The controller 24 also controls the amount of the clock delay in the delay circuit 16.

Figure 3:
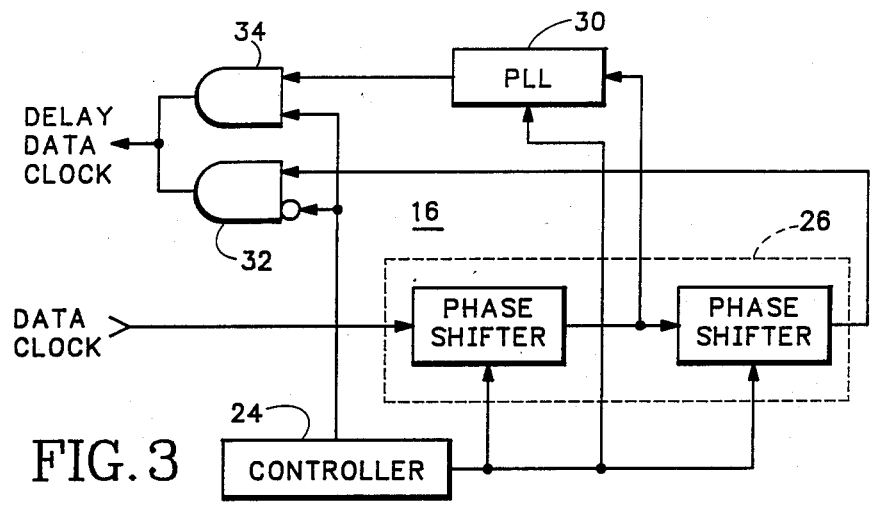
FIG. 3 is a block diagram of a clock delay circuit for the timing measurement system of FIG. 2.

The phase delay circuit 16 is shown in greater detail in FIG. 3. The data clock is input to a two-stage phase shifter 26 that shifts the data clock by an amount determined by the controller 24 so that the leading edge is near the transition between data words. The phase shifted clock from the first stage of the phase shifter 26 is input to a second stage where additional delay increments are added to produce the delayed clock for input to the timing register 12. Also included in the phase delay circuit 16 is a phase lock loop 30 having as an input the phase shifted clock from the first stage of the phase shifter 26. The phase lock loop 30 has a low bandwidth response so that jitter in the clock signal at the input is not reflected at the output, thus providing a stable clock signal essentially free from jitter. This stable clock signal is then input to the timing register 12 for comparison with the clock data input signal to determine the amount of clock jitter. A pair of gates 32, 34 are enabled by a LOOP_EN signal from the controller so that when the phase lock loop 30 is enabled the delayed stable clock is input to the timing register 12 for comparison with the data clock input, and when the phase lock loop is disabled the delayed clock is input to the timing register for comparison with each data bit of the data word.

In operation the controller 24 uses a timing search algorithm that moves the input data clock signal relative to the incoming data bit signals. The search algorithm operates on data words whose values are known, such as the (FF,00) transition of the timing reference signal. The clock is skewed until there is a change in the data value of any sample taken at that skew time and the skew time is recorded. The clock is skewed further until the data value of all samples has completely changed to the opposite state, the skew time again being recorded. The two recorded skew times are input to a display algorithm that presents the time interval between the skew times as a shaded area with respect to a reference point, namely the leading edge of the data clock pulse.

When the timing measurement system is initialized, the controller 24 establishes the reference point based upon the leading edge of the data clock signal, determining a delay count of the delay circuit 16 corresponding to the clock leading edge as the reference point. The sync clock signal from the sync detect circuit 18 starts the control counter 22 which outputs a TRS pulse to the controller 24 when the count reaches a predetermined count loaded by the controller. The TRS pulse causes the controller 24 to read the data clock value from the timing register 12, after which the controller reloads the counter 22 with the predetermined count for the next sample. After N samples have been read in this manner, the delay count to the phase delay circuit 16 is incremented and a new set of N samples is obtained. When all of the sample values are of one state, the end of the bit value has not yet been reached and the delay count is not recorded. As soon as at least one sample value within the set of samples has a different state, the delay count is stored as one extreme skew time value. The delay count continues to be incremented and additional sample sets are obtained until all the sample values of a sample set are of the opposite state, at which point the delay count is stored as the opposite extreme skew time value. The average of the two extreme delay counts provides the reference point, i.e., the leading edge of the data clock signal.

With the reference point established, each bit of the data signal is likewise sampled to establish the skew time extremes determined by delay counts from the controller 24 as described above. The data bit skew is the difference between the average of the extreme skew times represented by the stored delay counts and the reference point, and the data bit jitter with respect to the data clock signal is represented by the range between the extreme delay counts. The resulting array of extreme skew times for each bit path is converted into pixels for display upon an appropriate device, such as a liquid crystal display or a cathode ray tube, according to the equation $$DP = (DCOUNT - CC/2 + PS)(K1)(K2)$$

where DP is the display position in pixels along a horizontal axis of the display device, DCOUNT is the difference between the delay count value from the array and the reference point in delay counts, CC is one clock period in delay counts, PS is the path skew as a delay count difference between the clock reference point and the data bit path, K1 is a constant in picoseconds per count, and K2 is a constant in pixels per picosecond.

The determination of clock jitter is achieved by the controller 24 commanding the phase lock loop 30 ON and enabling the appropriate gate 34. The stable clock from the phase lock loop 30 is compared in like manner with the data clock signal at various delay counts input to the first stage of the phase shifter 26 to obtain the delay count extremes that represent the data clock jitter.

Figure 5:
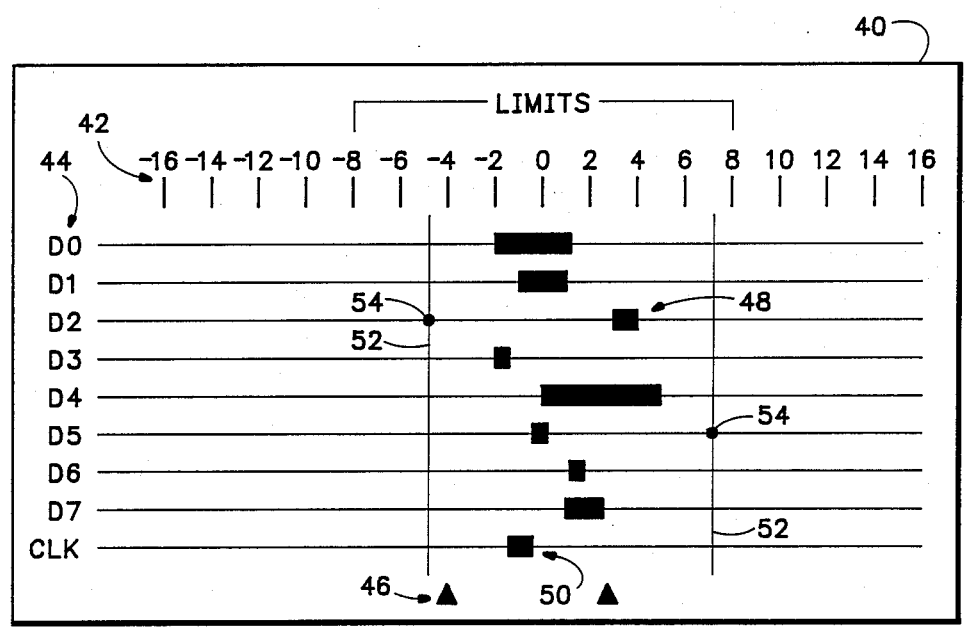
FIG. 5 is a display diagram for the timing measurement system according to the present invention.

The resulting display is shown in FIG. 5 which shows a display screen 40 having a time scale 42 at the top with any limits indicated, a column of identifiers 44 for each data bit and the clock with an associated horizontal line, and a clock jitter limit indicator 46 at the bottom. The path skew 48 is shown for each data bit path as a solid bar which represents the range of path skew for the most recent N samples with respect to the clock. The clock jitter 50 is shown in like manner. A pair of vertical cursors 52 indicate the extreme values of the path skew for the data bits since the measurement was started, with a solid dot 54 indicating the path that produced that extreme value. Thus the display shown indicates that the most recent path skew ranges for the data bit paths are −2 to 1 (D0), −1 to 1 (D1), 3 to 4 (D2), −1 (D3), 0 to 5 (D4), 0 to 1 (D5), 2 to 3 (D6) and 1 to 3 (D7) with a clock jitter between −1 and 0. The extreme path skews were attained by D2 at −5 and D5 at 7. This presents the ability to show both short term skew and long term skew on a single display.

Thus the present invention provides a timing measurement system for path skew and clock jitter by detecting a digital sync edge, detecting a transition between two digital words and sampling at a plurality of clock delays to accurately determine a range of path skews for each data bit path, and displaying the resulting ranges for each data bit path on a suitable display. Clock jitter is likewise determined by comparing the clock signal with a delayed stable clock signal generated from the clock signal.

What is claimed is:

1. A method of displaying a jitter timing measurement for a digital signal path with respect to a reference clock signal comprising the steps of:

acquiring a plurality of samples for a bit of a specified data word of a repetitive signal, the specified data word having a known value, from the digital signal path at each of a plurality of sample times relative to an edge of the specified data word for each cycle of the repetitive signal to produce a set of sample values for each sample time, the sample times being derived from the reference clock signal;

examining each set to determine a first sample time for a first set where all the sample values are no longer all at a first state and a second sample time for a second step where all the sample values are all at a second state; and displaying the interval between the first sample time and the second sample time with respect to a reference time established by the reference clock signal.

2. A method as recited in claim 1 further comprising the steps of:

deriving a stable clock signal from the reference clock signal;

determining a clock jitter interval of the reference clock signal with respect to the stable clock signal; and displaying the clock jitter interval.

3. A method of displaying a clock jitter timing measurement for a clock signal comprising the steps of deriving a stable clock signal from the clock signal;

acquiring a plurality of samples of the clock signal at each of a plurality of sample times relative to an edge of the clock signal to produce a set of sample values for each sample time, the sample times being derived from the stable clock signal;

examining each set to determine a first sample time for a first set where all the sample values are no longer all at a first state and a second sample time for a second set where all the sample values are all at a second state; and displaying the interval between the first sample time and the second sample time with respect to a reference time that is the average of the first and second sample times.

4. An apparatus for displaying a jitter timing measurement for a digital signal path with respect to a reference clock signal comprises:

means for acquiring a plurality of samples for a bit of a specified data word of a repetitive digital signal, the specified data word having a known value, from the digital signal path at each of a plurality of sample times relative to an edge of the specified bit to produce a set of sample values for each sample time, the sample times being derived from the reference clock signal;

means for examining each set to determine a first sample time for a first set where all the sample values are no longer all at a first state and a second sample time for a second set where all the sample values are at a second state; and means for displaying the interval between the first and second sample times with respect to a reference time established by the reference clock signal.

5. An apparatus as recited in claim 4 wherein the acquiring means comprises:

means for identifying the specified data word;

means for generating a delayed clock signal from the reference clock signal; and means for sampling the specified data word with the delayed clock signal to produce the sets of samples values for each sample time.

6. An apparatus as recited in claim 5 wherein the identifying means comprises:

means for determining a start point for each cycle of the repetitive signal; and means for counting the reference clock signal to a predetermined count to produce a test reference signal corresponding to the specified data word.

7. An apparatus as recited in claim 4 further comprising:

means for deriving a stable clock signal from the reference clock signal;

means for determining a clock jitter interval of the reference clock signal with respect to the stable clock signal; and means for displaying the clock jitter interval with respect to the reference time.

8. An apparatus for displaying a clock jitter timing measurement for a clock signal comprising:

means for deriving a stable clock signal from the clock signal;

means for acquiring a plurality of samples of the clock signal at each of a plurality of sample times relative to an edge of the clock signal to produce a set of sample values for each sample time, the samples times being derived from the stable clock signal;

means for examining each set to determine a first sample time for a first set where all the sample values are no longer at a first state and a second sample time for a second set where all the sample values are at a second state; and means for displaying the interval between the first sample time and the second sample time with respect to a reference time that is the average of the first and second sample times.

* * * * *